United States Patent [19]
Woods et al.

[11] Patent Number: 5,113,399
[45] Date of Patent: May 12, 1992

[54] MEMORY TEST METHODOLOGY

[75] Inventors: Ralf D. Woods, Corona; Michael P. Slack, Tustin; Kenneth M. Gerst, Pasadena, all of Calif.

[73] Assignee: Rockwell International Corporation, Seal Beach, Calif.

[21] Appl. No.: 510,365

[22] Filed: Apr. 17, 1990

Related U.S. Application Data

[63] Continuation-in-part of Ser. No. 422,317, Oct. 16, 1989, Pat. No. 4,985,674.

[51] Int. Cl.⁵ .............................................. G06F 11/00
[52] U.S. Cl. .............................. 371/21.3; 364/DIG. 2; 364/265.3; 364/266.4; 364/221.7
[58] Field of Search .............. 365/201; 371/21.2, 21.3; 364/200 MS File, 900 MS File

[56] References Cited

U.S. PATENT DOCUMENTS

| | | | |
|---|---|---|---|
| 3,579,199 | 5/1971 | Anderson et al. | 364/200 |
| 3,719,929 | 3/1973 | Fay et al. | 364/200 |
| 4,654,849 | 3/1987 | White, Jr. et al. | 371/21.3 X |
| 4,788,684 | 11/1988 | Kawaguchi et al. | 371/21.2 |
| 4,819,212 | 4/1989 | Nakai et al. | 365/201 X |
| 4,841,525 | 6/1989 | Lieske et al. | 371/21.3 |
| 4,951,254 | 8/1990 | Ontrop et al. | 365/201 |
| 4,958,345 | 9/1990 | Fujisaki | 371/21.3 |
| 4,965,799 | 10/1990 | Green et al. | 371/21.3 X |

Primary Examiner—Thomas M. Heckler
Attorney, Agent, or Firm—H. Fredrick Hamann; George A. Montanye; Tom Streeter

[57] ABSTRACT

A MEMORY TEST METHODOLOGY is disclosed. The memory is checkerboarded and divided into blocks, the cells of which are scrambled by a EEPROM. The memory is the assaulted. After each assault, one block (time-test) is tested in alternation with each of the other blocks (space-test) by reading each cell of the clock, comparing it with the checkerboard, and writing the opposite of the checkerboard to the cell. When this process has been completed for all blocks, it is repeated, this time writing the checkerboard to each cell. Failures are noted on a fast capture RAM. This cycle is repeated several times. The data is displayed, and the memory is assaulted again. It is re-checkerboarded immediately before the assault. Errors in the time test block are displayed separately from those in the space-test blocks, and both displays are repeated in the same format after each assault.

14 Claims, 7 Drawing Sheets

MEMORY TEST METHODOLOGY

This invention was made with Government support under Contract No. F04704-B7-C-0149 awarded by the Air Force. The Government has certain rights in this invention.

This application is a continuation-in-part of application Ser. No. 07/422,317, Real Time Hostile Environment Memory Tester Interface, filed Oct. 16, 1989, now U.S. Pat. No. 4,985,674, the disclosure of which is incorporated herein by reference and which is assigned to the assignee of this application.

BACKGROUND OF THE INVENTION

This invention relates to methods for testing an electronic memory, and has particular reference to methods for testing such memories when they are subjected to repeated assaults.

Electronic memories can be assaulted in any of a number of ways. They may be subjected to repeated bursts of radiation, whether of electrons, photons, or other particles, which tends to cause bit-flips by secondary electron emission. They may be subjected to repeated thermal shocks, or to repeated mechanical shocks. Other assaults will occur to those skilled in the art. Regardless of the nature of the assault, it is desirable to know how well the memory will operate when subjected thereto. "Operate" in this sense comprises two facets. First, the memory should be able to retain, after the assault, the information which had been stored in it before the assault; that is, there should be no bit-flips. Second, the memory should remain functional; that is, it should be possible, both during and after the assault, for information to be written to the memory, and to be read from it.

There is yet a third facet to memory testing. It is not enough that the memory have tested well immediately after production. Once a memory has been assaulted in the field, it is desirable to be able to retest the memory and to accurately determine whether or not it has at least retained its functionality. There may be some memories, for example, which appear to have recovered their functionality shortly after being assaulted, but which then lose their functionality after this brief interval period. If a field test of functionality is to be made, it must be done so that it does not pick up this false window of functionality, and incorrectly determine that no permanent damage has been done when actually only temporary damage has been avoided. These windows of functionality can be determined during factory testing.

The prior art in memory testing has been to load a memory with information, to subject the memory to a hostile environment for an extended period of time, and to then examine the contents of the memory for retention, and to attempt to read from and write to the memory to see how well it still functions. This is an appropriate test when, under field conditions, the memory will be subjected to hostile conditions, but not to repeated assaults. The prior art has had to simulate repeated assaults by making the environment excessively harsh, but nonetheless steady. Alternatively, if a memory was subjected to repeated assaults, it was not tested after each assault, but only after the series of assaults. This testing, while valuable, can be improved upon.

SUMMARY OF THE INVENTION

It is an objective of the present invention to improve upon the prior art by providing an electronic memory test methodology which allows every cell of the memory to be tested, which tests for windows of functionality, and which tests after each of a series of assaults. It does so by examining every cell a plurality of times after each assault, and by examining a small subset of the cells a great multiplicity of times after each assault, scrambling the order of examination of the cells to reduce the effect of the sampling strategy on the observed results. It is quick enough to allow the results of these tests to be displayed in real time.

BRIEF DESCRIPTION OF THE DRAWINGS

These and other objectives, features, and advantages can be seen in reference to the following drawings, in which.

DETAILED DESCRIPTION OF A PREFERRED EMBODIMENT

Figure 1:
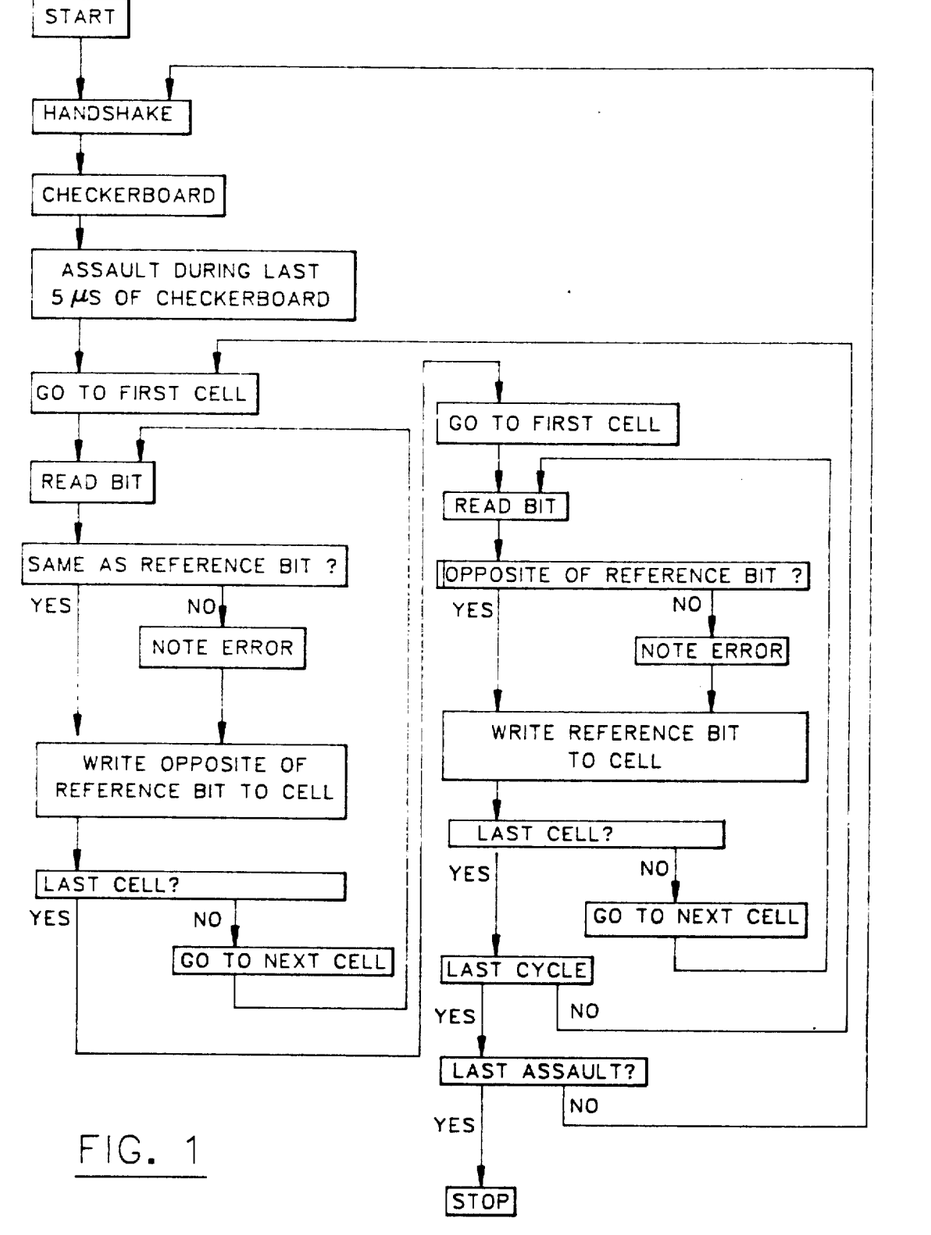
FIG. 1 is a flow chart of the overall test methodology.

Turning now to FIG. 1, a flow chart showing the overall operation of the present invention is shown. After starting, a handshake takes place between the error data capture apparatus and the data analysis apparatus to ensure that both are suitably initialized. Initialization continues with the checkerboard step, in which the memory, typically, although not necessarily, a random access memory (RAM), is loaded with 1s and 0s. A RAM typically comprises a matrix of cells. In checkerboarding, cells on odd numbered rows are loaded with a "1" if on an even numbered column, and a "0" if on an odd numbered column; on even numbered rows this loading is reversed. Checkerboarding is desirable in testing a memory because cells, when assaulted, are more likely to lose their contents (that is, to bit-flip) when adjoining cells have the opposite bit in them. The term "checkerboarding" includes any systematic loading of a memory, even if 1s and 0s are entered at random, provided that the bit in each cell can be compared to a reference bit, showing what bit the cell was first loaded with, before the first assault.

Checkerboarding is done one row at a time, column by column. During the final moments of checkerboarding (5 microseconds is suitable for a 4K simox RAM) the memory is assaulted. A suitable assault used by Applicants has been a 5 microsecond pulse of electrons from a linear accelerator (LINAC) in excess of $10^9$ RAD(Si)/sec. Thus, immediately upon the end of the assault, memory testing may begin. The first cell of the memory is read, and the bit in that cell, as read, is compared with the bit as originally checkerboarded, that is, the reference bit. If they are different, then an error is noted; if not, it is not noted. This tests the ability of that particular cell to retain information through an assault. The cell is then written over with the opposite of the reference bit. This overwriting is done to set up the next test, which will be described below. If this is not the last cell, then the next cell is selected and tested as above.

If it is the last cell, then the first cell is selected again. The cell is read, and its bit is compared with the reference bit to see if it is the opposite of the reference bit. It will be recalled that, immediately after having first been read, it was written to the opposite of the reference bit. If it is not the opposite of the reference bit, then, again, an error is noted. In any event, the reference bit is then again written onto the cell, thereby restoring it to its original configuration. If this is not the last cell, then the next cell is selected and is likewise tested. This test tests the ability of that particular cell to be written to, and read from, immediately after having been assaulted. This test is continued cell by cell throughout the memory until the last cell is reached. This completes one cycle of testing.

This cycle of testing can be continued for as long as it takes the memory to settle into a steady state condition. The appropriate number of cycles can be predetermined, based on a historical average, or it can be dynamically determined if the analyzing apparatus is fast enough. In general, it is much quicker to note an error than it is to analyze it, so a dynamic determination of the number of cycles to run is generally not preferred.

When the last cycle has been performed, the data which has been captured during the "note error" steps is transferred to a computer for analysis. This is the "handshake" step. Applicants have discovered that this handshake step generally takes about 300 milliseconds. During this time, the RAM continues to recover from the assault. When the handshake has been completed, the RAM is re-checkerboarded and, during the last 5 microseconds of checkerboarding, is again assaulted. If the memory were perfect, re-checkerboarding would not be necessary, since, as the last part of the read/write testing of each bit, the reference bit was written to each cell. However, memories will sometimes fail, which is the entire purpose of the test. Writing the reference bit to the cell as long as possible after the assault is most likely to result in the RAM actually containing the correct information.

The foregoing test protocol, unmodified, tests low numbered addresses earlier after the assault than it tests high numbered addresses. This bias can be eliminated by having the tester not connected directly to the RAM, but by instead passing signals from the tester through a EEPROM. The EEPROM uniquely, but randomly, associates each address received from the tester with an address in the RAM. While the tester considers that it is testing bits in a phantom RAM in serial number order, the bits in the actual RAM are tested in a scrambled order. This eliminates any spatial bias.

While this form of scrambling eliminates spatial bias, it does require that each and every one of the 4K cells be tested before any cell can be retested. This delay is often unacceptable. It is therefore preferable to divide the RAM into a fairly large number of blocks. In the 4K simox RAM used by Applicants, 64 blocks of 64 bits each were used. These blocks are called "space-test blocks" since, from the tester's point of view, each represents a compact space within the RAM.

A 65th block is then designated, to be called the "time-test block." This time-test block may be one of the space-test blocks, or it may be a scrambled mixture from many space-test blocks. In any event, the time-test block is first tested, then the first space-test block is tested, then the time-test block is retested, the second space block is tested, then the time-test block is retested again, then the third space-test block is tested, and so on until all of the space-test blocks have been tested. The time-test block is thus tested, in the above example, 64 times more frequently than any of the space-test blocks. At megahertz order test rates, which Applicants have accomplished, this results in microsecond order testing of at least selected cells of the memory. At the same time, the entire RAM can be tested on the order of milliseconds.

Figure 2:
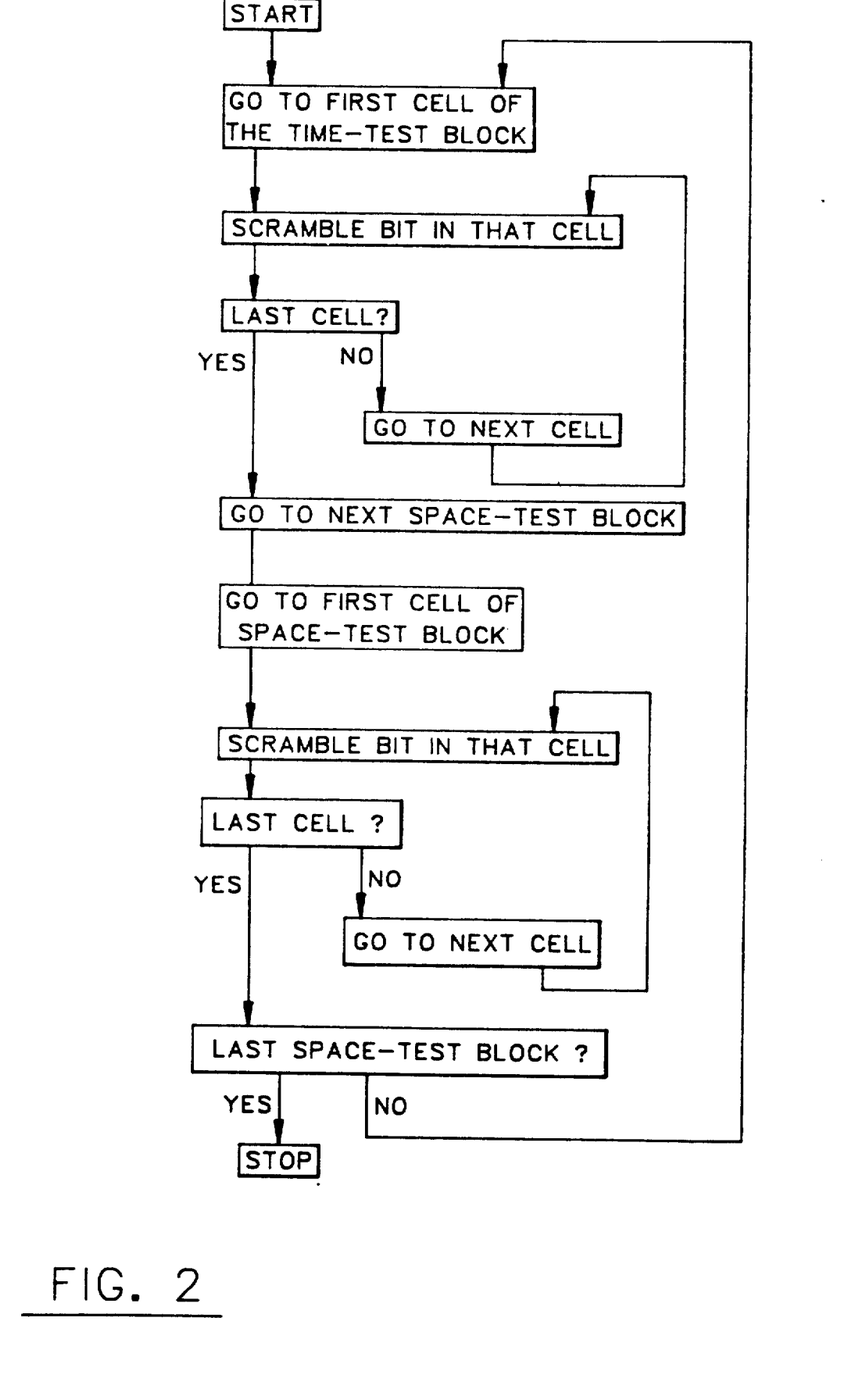
FIG. 2 is a flow chart of the interleaving of a time-test block with a plurality of space-test blocks.

The actual procedure for mixing time-test and space-test blocks is shown in FIG. 2. One starts by going to the first cell of the time-test block, and scrambling that cell's bit to a different cell, as through a EEPROM. If that is not the last cell of the time-test block, then one goes to the next cell, scrambles that bit, and so on until the last cell is reached. One then goes to the next space-test block, and to the first cell of that block. That cell's bit is scrambled and, if not the last cell, one goes to the next cell. If it is the last cell of the space-test block, and if it is not the last space-test block, then the first cell of the time-test block is readdressed. When the time-test block has been gone through, the next space-test block is gone through, and this alternating between space and time-test blocks is continued until the last space-test block, when the process stops.

Figure 3:
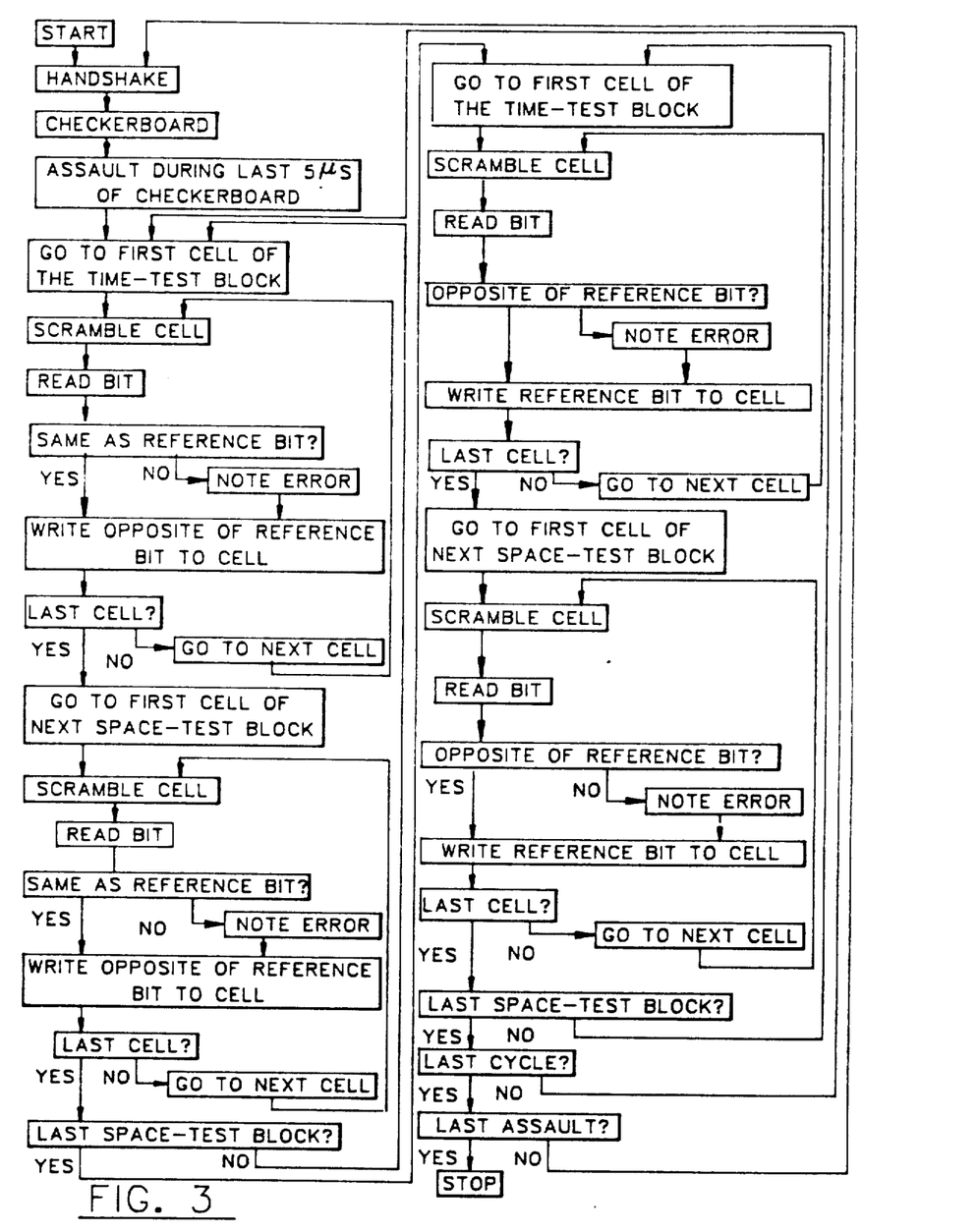
FIG. 3 is a flow chart combining FIG. 1 and FIG. 2.

FIG. 3 combines FIG. 1 and FIG. 2.

Figure 4:
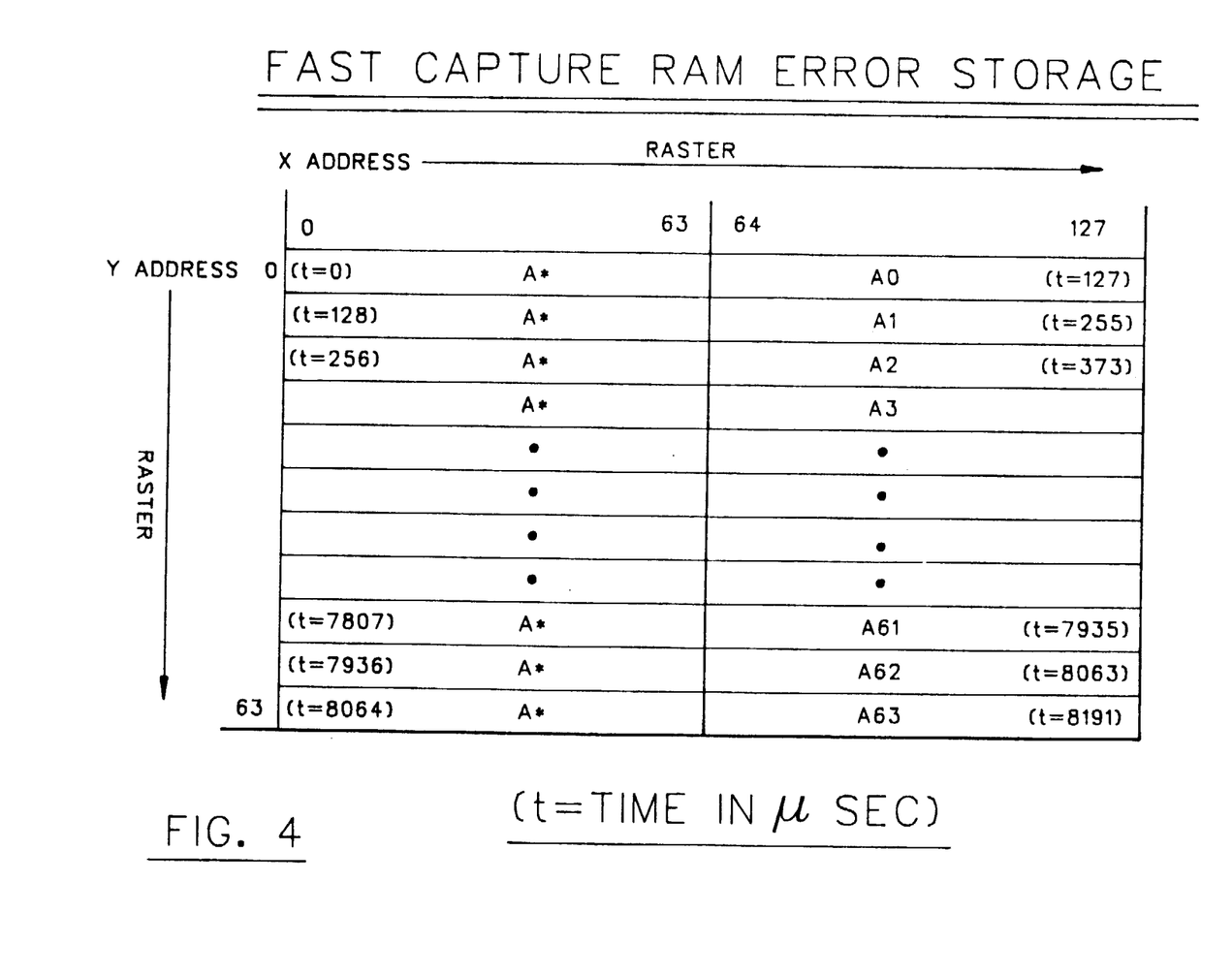
FIG. 4 is a diagram of how data from a particular assault may be stored in a fast capture RAM.

FIG. 4 shows how the error data may be stored in a fast capture RAM. The raster scans across the X axis, and, upon reaching the right most X address, increases the Y axis by 1, and repeats X axis scanning. A*, as shown in FIG. 4, shows the errors found in the time-test block. AO shows the errors found in the first space-test block. After a little less than 8.2 milliseconds, the entire RAM has been scanned and the errors stored.

Figure 5:
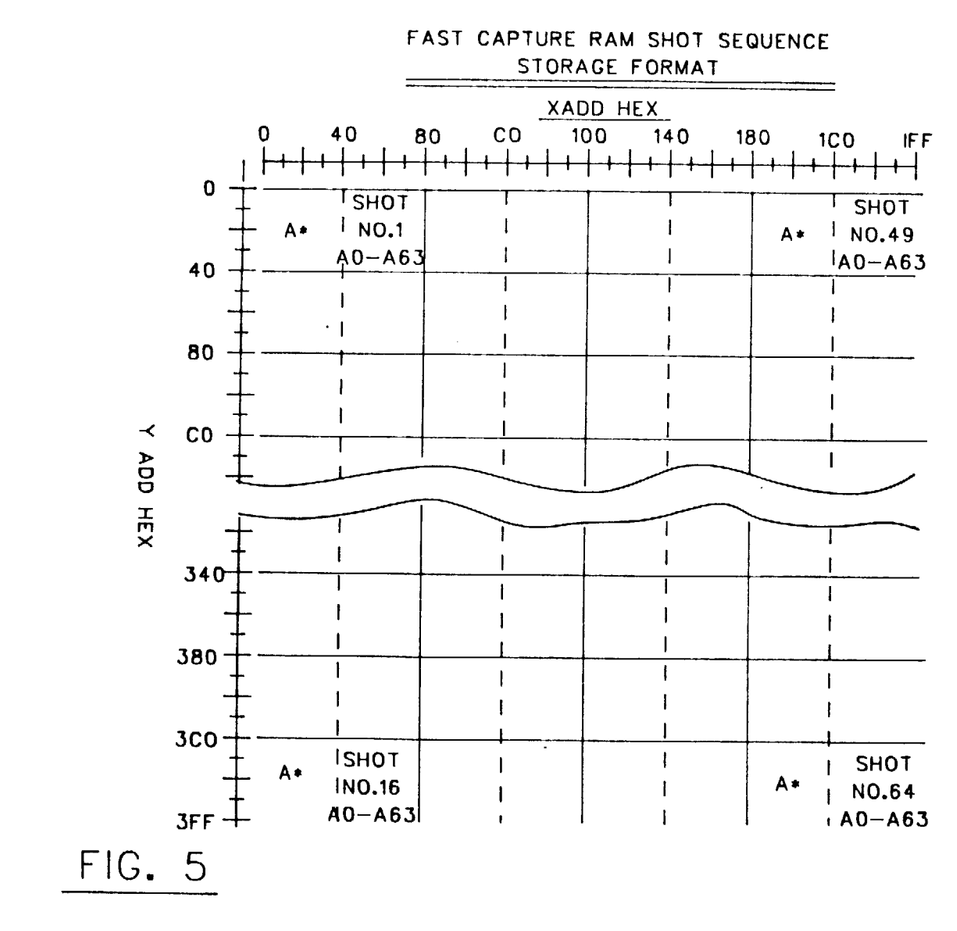
FIG. 5 is a diagram of how data from all of the assaults may be captures on a single fast capture RAM.

FIG. 4 shows only a portion of the fast capture RAM. The entire fast capture RAM is shown in FIG. 5. Each assault, or shot, is represented by a memory section 128 bits (80 hex) wide and 64 bits (40 hex) high. Starting at the upper left corner of the fast capture RAM, consecutive shots are recorded in consecutively lower blocks until shot 16. Shot 17 is immediately to the right of shot number 1. This continues until shot 64 in the lower right hand corner.

Figure 6:
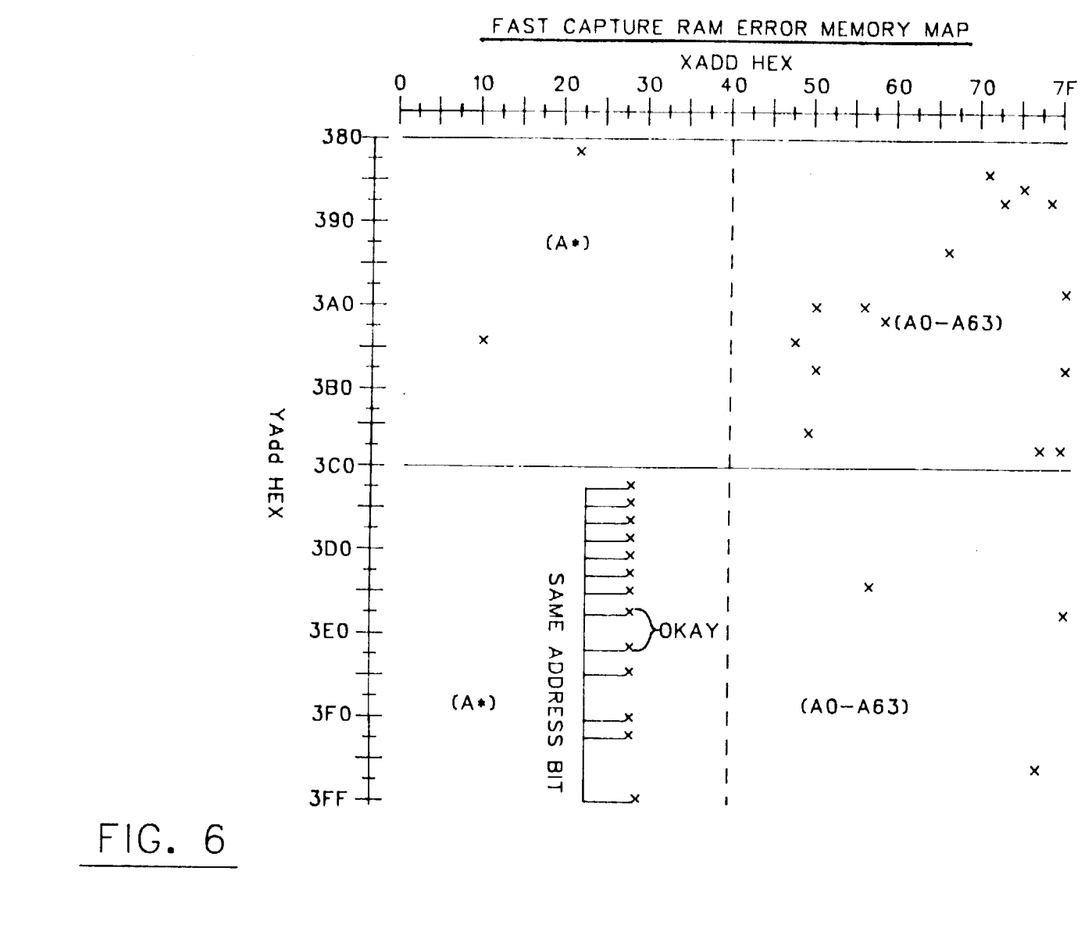
FIG. 6 is a typical display of the errors produced by a pair of assaults, showing both temporal and spatial distributions.

FIG. 6 shows a detailed description of shots 15 and 16, which appear in the lower left corner of FIG. 4. The upper right quadrant of FIG. 6 shows 4K tokens, in a 64×64 array, which spatially show cell failures in the actual RAM, not in the phantom RAM as seen by the tester. The upper left quadrant of FIG. 6 shows the 64 selected time-test cells, with the Y axis going downward for increasing time. Only two of the 64 cells failed, and each failed only once during the 64 times when it was tested.

The lower left quadrant of FIG. 6 shows the dramatic difference between shot 16 and shot 15. In shot 16, only one of the 64 time-test cells failed, but it failed repeatedly, first 8 times in succession as shown in the upper portion of this quadrant, and then intermittently throughout the remainder of the test. If, in the field, this particular cell had been tested during the time interval marked "okay," it would have tested okay, yet, as is easily seen, it had not completely recovered from shot 16. The lower right quadrant of FIG. 6 shows, spatially, that only three of the 4K cells failed during shot 16, as opposed to the 16 cells which failed during shot 15.

It must be reiterated that the X and Y axes mean different things on the left and right sides of FIG. 6. On the right side, the X and Y axes indicate X and Y position in the actual RAM. On the left side of FIG. 6, the X axis is an arbitrarily selected index for one of 64 randomly selected cells, and the Y axis represents increasing time. There is, therefore, no necessary overlap between the representations shown on the left and right sides of a single shot, and, as an inspection of FIG. 6 reveals, there is no actual overlap.

The errors detected in the time-test cells may be repeatedly displayed, shot-to-shot, allowing failure patterns to be displayed in the same format with increasing time. The same is true of space-test cells. The shot-to-shot display may be spatial or, as preferred by Applicants, temporal.

Figure 7:
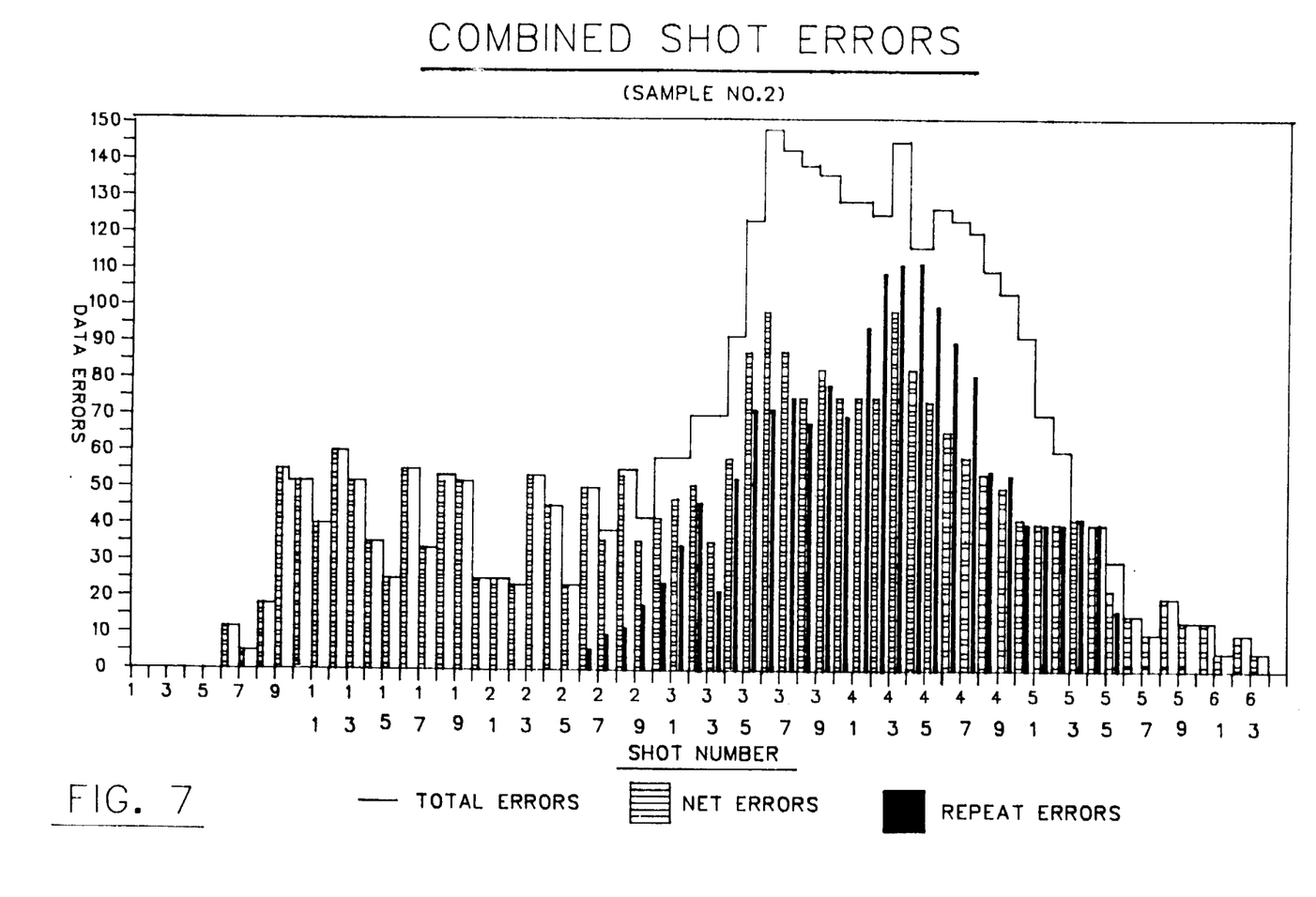
FIG. 7 is a histogram of the errors produced in a RAM which was assaulted 64 times.

FIG. 7 shows the net errors, repeat errors and total errors produced in a memory over a series of 64 shots. The "net error" number is the number of cells which failed with any particular shot, counting each cell in the time-test block which failed as a single failure, regardless of how many times it failed. The "total error" number is similar, except that each cell which fails in the time-test block is counted each time it fails. The "repeat error" number is the combined number of errors in the time-test block, counting each cell each time it fails, but not including the first time it fails. Arithmetically, it is the difference between the "total error" number and the "net error" number.

INDUSTRIAL APPLICABILITY

The present invention is capable of exploitation in industry, and can be used, whenever it is desired to test an electronic memory which is subject to multiple assaults. It can be made from components which, taken individually, are entire conventional, or it can be made from their nonconventional counterparts.

While a particular embodiment of the present invention has been described above, the true spirit and scope of the present invention is not limited to this embodiment, but is limited only by the following claims.

What is claimed is:

1. A method for testing a memory, comprising:
(a) checkerboarding the memory;
(b) assaulting the memory;
(c) selecting a cell in a time-test block;
(d) reading the bit in a scrambled cell corresponding to said cell;
(e) comparing the bit as read with a respective reference bit, and noting any error;
(f) writing the opposite of the reference bit to the scrambled cell;
(g) repeating steps (c) through (f) until every cell in the time-test block has been subjected to such steps;
(h) selecting a cell in a space-test block;
(i) reading the bit in a scrambled cell corresponding to said cell;
(j) comparing the bit as read with a respective reference bit, and noting any error;
(k) writing the opposite of the reference bit to the scrambled cell;
(l) repeating steps (c) through (f) until every cell in the space-test block has been subjected to such steps;
(m) re-subjecting the cells of the time-test block to steps (c) through (g);
(n) selecting a next space-test block;
(o) subjecting the cells of said next space-test block to steps (h) through (l);
(p) repeating steps (m) through (o) until every space-test block has been subjected to such steps;
(q) repeating steps (c) through (p) a plurality of times;
(r) repeating steps (a) through (q) a plurality of times.

2. The method of claim 1, further comprising the step of displaying a token for each failure of a cell in the time-test block, repeated failures of the same cell being displayed by tokens on a same row or column, and concurrent or approximately concurrent failures of different cells being displayed by tokens on a same column or row.

3. The method of claim 2, further comprising the step of repeatedly displaying, in the same format, the failures induced by repeated assaults.

4. The method of claim 1, further comprising the step of displaying a token for each failure of a cell, each cell failure being displayed on a row and column which represents a row and column location of the cell in the memory.

5. The method of claim 4, further comprising the step of repeatedly displaying, in the same format, the failures induced by repeated assaults.

6. The method of claim 1, further comprising the steps of:
(a) displaying a token for each failure of a cell in the time-test block, repeated failures of the same cell being displayed by tokens on a same row or column, and concurrent or approximately concurrent failures of different cells being displayed by tokens on a same column or row; and
(b) simultaneously displaying a token for each failure of a cell, each cell failure being displayed on a row and column which represents a row and column location of the cell in the memory.

7. The method of claim 6, further comprising the step of repeatedly displaying, in the same format, the failures induced by repeated assaults.

8. Means for testing a memory, comprising:
(a) means for checkerboarding the memory;
(b) means for assaulting the memory;
(c) means for selecting a cell in a time-test block;
(d) means for reading the bit in a scrambled cell corresponding to said cell;
(e) means for comparing the bit as read with a respective reference bit, and for noting any error;
(f) means for writing the opposite of the reference bit to the scrambled cell;
(g) means for repeating steps (c) through (f) until every cell in the time-test block has been subjected to such steps;
(h) means for selecting a cell in a space-test block,
(i) means for reading the bit in a scrambled cell corresponding to said cell;
(j) means for comparing the bit as read with a respective reference bit, and noting any error;
(k) means for writing the opposite of the reference bit to the scrambled cell;
(l) means for repeating steps (c) through (f) until every cell in the space-test block has been subjected to such steps;
(m) means for re-subjecting the cells of the time-test block to steps (c) through (g).
(n) means for selecting a next space-test block;

(o) means for subjecting the cells of said next space-test block to steps (h) through (l).

(p) means for repeating steps (m) through (o) until every space-test block has been subjected to such steps;

(q) means for repeating steps (c) through (p) a plurality of times;

(r) means for repeating steps (a) through (q) a plurality of times.

9. The means of claim 8, further comprising means for displaying a token for each failure of a cell in the time-test block, repeated failures of the same cell being displayed by tokens on a same row or column, and concurrent or approximately concurrent failures of different cells being displayed by tokens on a same column or row.

10. The means of claim 9, further comprising means for repeatedly displaying, in the same format, the failures induced by repeated assaults.

11. The means of claim 8, further comprising means for displaying a token for each failure of a cell, each cell failure being displayed on a row and column which represents a row and column location of the cell in the memory.

12. The means of claim 11, further comprising means for repeatedly displaying, in the same format, the failures induced by repeated assaults.

13. The means of claim 8, further comprising:

(a) means for displaying a token for each failure of a cell in the time-test block, repeated failures of the same cell being displayed by tokens on a same row or column, and concurrent or approximately concurrent failures of different cells being displayed by tokens on a same column or row; and (b) means for simultaneously displaying a token for each failure of a cell, each cell failure being displayed on a row and column which represents a row and column location of the cell in the memory.

14. The means of claim 13, further comprising means for repeatedly displaying, in the same format, the failures induced by repeated assaults.

* * * * *